(12) United States Patent
Ikedo

(10) Patent No.: US 7,691,205 B2
(45) Date of Patent: Apr. 6, 2010

(54) SUBSTRATE-SUPPORTING DEVICE

(75) Inventor: Yozo Ikedo, Tama (JP)

(73) Assignee: ASM Japan K.K., Tokyo (JP)

( * ) Notice: Subject to any disclaimer, the term of this patent is extended or adjusted under 35 U.S.C. 154(b) by 176 days.

(21) Appl. No.: 11/252,918

(22) Filed: Oct. 18, 2005

(65) Prior Publication Data

US 2007/0089670 A1 Apr. 26, 2007

(51) Int. Cl.
*C23C 16/46* (2006.01)
*C23C 16/00* (2006.01)
*H01L 21/306* (2006.01)

(52) U.S. Cl. .................. 118/728; 118/715; 156/345.51

(58) Field of Classification Search ................. 118/715, 118/728, 50; 156/345.51
See application file for complete search history.

(56) References Cited

U.S. PATENT DOCUMENTS

| | | | |
|---|---|---|---|
| 5,531,835 A | * | 7/1996 | Fodor et al. ................. 118/728 |
| 5,534,073 A | * | 7/1996 | Kinoshita et al. ........... 118/728 |
| 6,063,203 A | * | 5/2000 | Satoh ......................... 118/728 |
| 6,245,152 B1 | * | 6/2001 | Imai et al. ................... 118/728 |
| 6,464,795 B1 | * | 10/2002 | Sherstinsky et al. ......... 118/728 |
| RE38,937 E | * | 1/2006 | Nakamura ................... 117/102 |
| 2005/0022746 A1 | * | 2/2005 | Lampe et al. ............... 118/728 |
| 2005/0115679 A1 | * | 6/2005 | Kurosawa et al. ...... 156/345.51 |
| 2007/0079761 A1 | * | 4/2007 | Yendler et al. .............. 118/728 |
| 2007/0089670 A1 | * | 4/2007 | Ikedo ......................... 118/50 |

FOREIGN PATENT DOCUMENTS

JP 10-340896 * 12/1998

* cited by examiner

*Primary Examiner*—Jeffrie R Lund
(74) *Attorney, Agent, or Firm*—Knobbe, Martens, Olson & Bear LLP

(57) ABSTRACT

A substrate-supporting device for CVD having a substrate-supporting region includes: a substrate-supporting surface which is a continuous surface defining a reference plane on which a substrate is placed; and multiple dimples having bottom surfaces lower than the reference plane. The respective dimples are isolated from each other by a portion of the substrate-supporting surface.

19 Claims, 8 Drawing Sheets
(1 of 8 Drawing Sheet(s) Filed in Color)

|  | E-60 | Emboss | | | |
| --- | --- | --- | --- | --- | --- |
|  | TP-0 | TP-1 | TP-2 | TP-3 | TP-4 |
| Wafer Contact Ratio [%] | - | 18 | 6 | 23 | 50 |
| Depo Rate [A/min] | 5931 | 5840 | 5856 | 5845 | 5828 |
| Uniformity [±%] | 1.12 | 1.85 | 2.98 | 1.48 | 1.09 |
| R.I. | 1.467 | 1.467 | 1.464 | 1.467 | 1.470 |
| Stress [MPa] | -193.2 | -192.6 | -164.5 | -195.9 | -201.1 |

Fig. 4

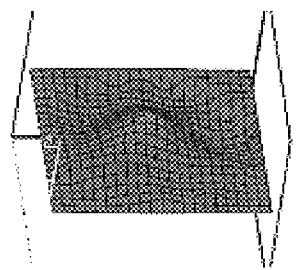
Fig. 5(a): TP-0
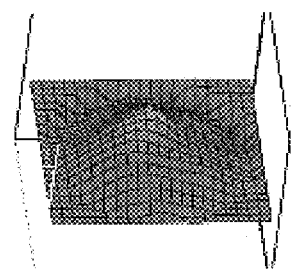
Fig. 5(b): TP-1
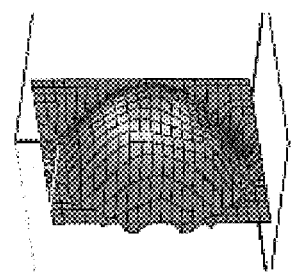
Fig. 5(c): TP-2
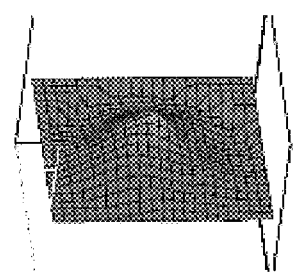
Fig. 5(d): TP-3
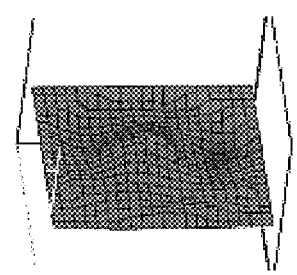
Fig. 5(e): TP-4

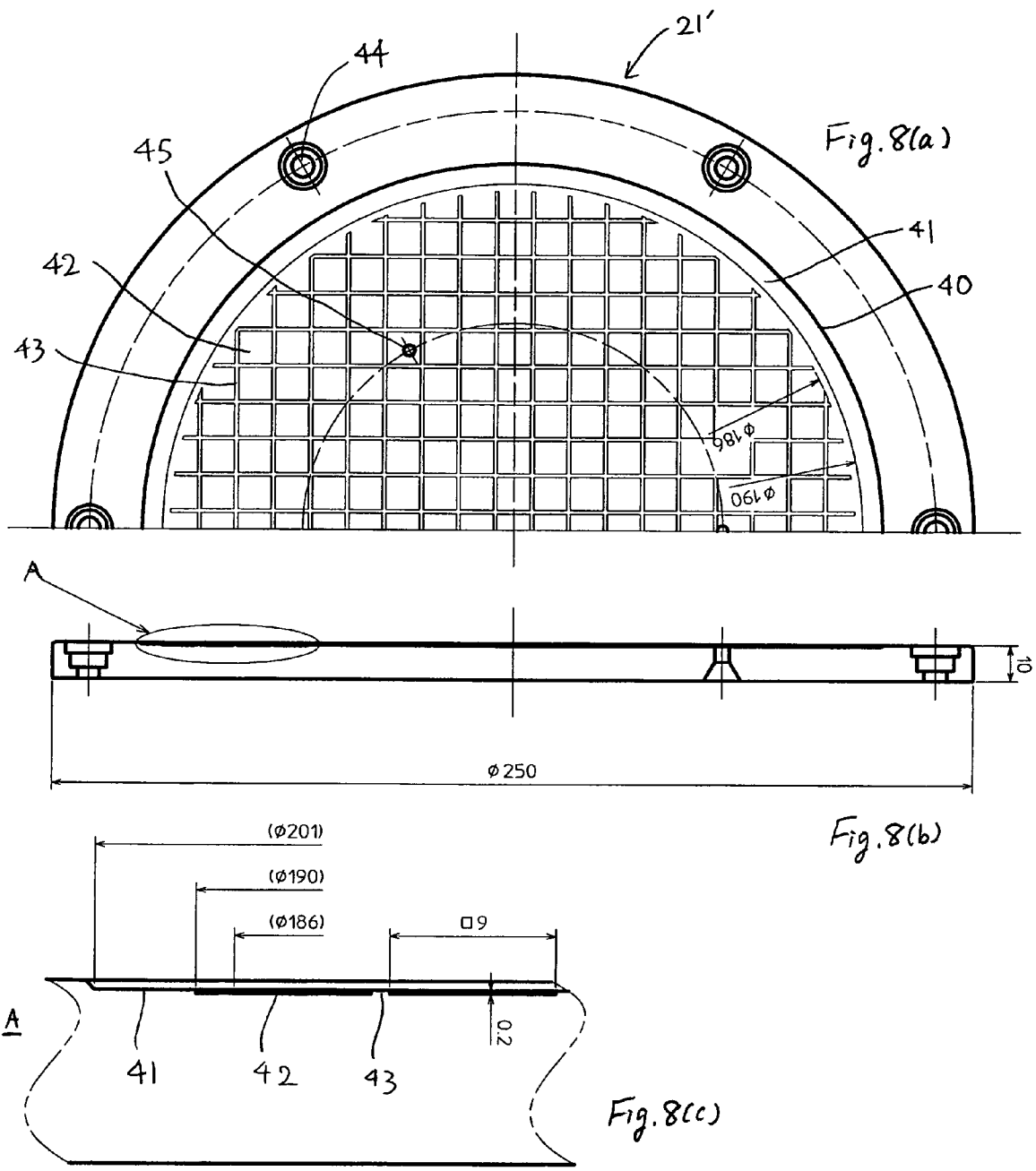

SUBSTRATE-SUPPORTING DEVICE

BACKGROUND OF THE INVENTION

1. Field of the Invention

The present invention generally relates to a substrate-supporting device configured to be installed in a CVD apparatus for forming a thin film on a substrate. The present invention also relates to a CVD apparatus in which the substrate-supporting device is installed.

2. Description of the Related Art

FIG. 1 is a schematic diagram of a conventional plasma CVD apparatus. The plasma CVD apparatus 1 comprises a reaction chamber 6, a gas inlet port 5, and a second electrode composed of a susceptor 3 which serves as a supporting portion and a heater 2. From a gas line which is not shown, a gas is introduced through the gas inlet port 5. A circular first electrode 9 is disposed just below the gas inlet port 5. The first electrode 9 has a hollow structure, and a number of fine pores provided on the bottom surface from which the gas is jetted out to a wafer which is a workpiece. Additionally, the first electrode 9 is configured to be replaceable with a shower plate 11 having multiple gas inlet holes for facilitating maintenance and reducing component costs.

Additionally, at the bottom of the reaction chamber 6, an exhaust port 10 is provided exhaust port 10 is joined with an external vacuum pump which is not shown, through which inside the reaction chamber 6 is exhausted. The susceptor 3 is disposed parallel to facing the first electrode 9. The susceptor 3 supports a wafer 4 on it and heats the wafer continuously by the heater 2 to maintain it at a given temperature (−50° C. to 650° C. The gas inlet port 5 and the first electrode 9 are insulated from the reaction chamber 6 and connected to an external first radio-frequency power source 7. A second radio-frequency source 8 may also be connected at this time.

The susceptor 3 is generally made of aluminum or aluminum alloy, and the surface is constituted by an anodized oxide film to provide a protective coat. As is conventionally known, wafer sticking occurs if the susceptor having this construction is used; therefore, for the purpose of reducing a contact area of a wafer and a susceptor, measures such as blasting, blasting+chemical treatment (some etching), blasting+polishing (Japanese Patent Laid-open No. 1998-340896) and providing regions of high elevation on a susceptor surface (U.S. Pat. No. 5,531,835) are taken.

SUMMARY OF THE INVENTION

In recent years, it is strongly desired to manufacture intended film characteristics of films of various types with stable and satisfactory controllability and without apparatus troubles. Using conventional techniques, however, because of low controllability of and considerable individual difference in a susceptor surface state, a contact area of the wafer and the susceptor varies widely. Additionally, even in conventional improved techniques, it is difficult to sufficiently reduce wafer sticking; and if wafer sticking is reduced, it produces problems of worsening of film characteristics such as worsening of within-film uniformity of film thickness and stress.

An object of the present invention is to control wafer sticking by reducing a contact area of a wafer and a susceptor. Another object of the present invention is to improve controllability of a susceptor surface state. Still another object of the present invention is to obtain intended film characteristics of films comprising silicon nitride, silicon oxide (USG, BPSG, PSG, BSG), silicon oxynitride, low-k F-doped silicon oxide, low-k C-doped silicon oxide, etc. by eliminating individual difference between the susceptors when thin films of the respective film types are formed. Further, still another object of the present invention is to produce the above-mentioned films with stable and satisfactory controllability and without apparatus troubles. The present invention provides a substrate-supporting device for achieving one or more objects mentioned above, and a semiconductor-manufacturing apparatus to which the substrate-supporting device is provided.

According to an embodiment, the present invention is a substrate-supporting device a surface of which is patterned to have regions of high and low elevations and in which high regions support a workpiece (i.e., a substrate). The present invention provides the substrate-supporting device which is characterized in that the above-mentioned high regions are continuous.

Additionally, in an embodiment, a contact area of the above-mentioned high regions with a substrate being supported on it is 20% or less than a surface area of the workpiece.

Additionally, in an embodiment, a plane shape of the above-mentioned low region is a circle.

Further, in an embodiment, the substrate-supporting device is used in a semiconductor-manufacturing apparatus.

According to at least one of these embodiments, workpiece (substrate) sticking can be suppressed while controllability of a susceptor surface state is maintained.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The patent or application file contains at least one drawing executed in color. Copies of this patent or patent application publication with color drawing(s) will be provided by the Office upon request and payment of the necessary fee.

FIG. 4 is a table showing characteristics of films formed using the susceptors shown in FIG. 3.

Figure 3:
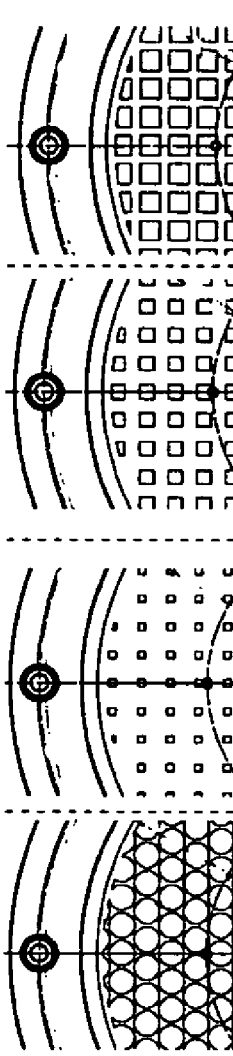
FIG. 3 is a chart showing profiles of a conventional susceptor, a susceptor according to an embodiment of the present invention, and comparative susceptors.

Results of film thickness uniformity are mapped in FIGS. 5(a)-(e), which respectively correspond to TP-0, TP-1, TP-2, TP-3, and TP-4 shown in FIG. 3.

Figure 6:
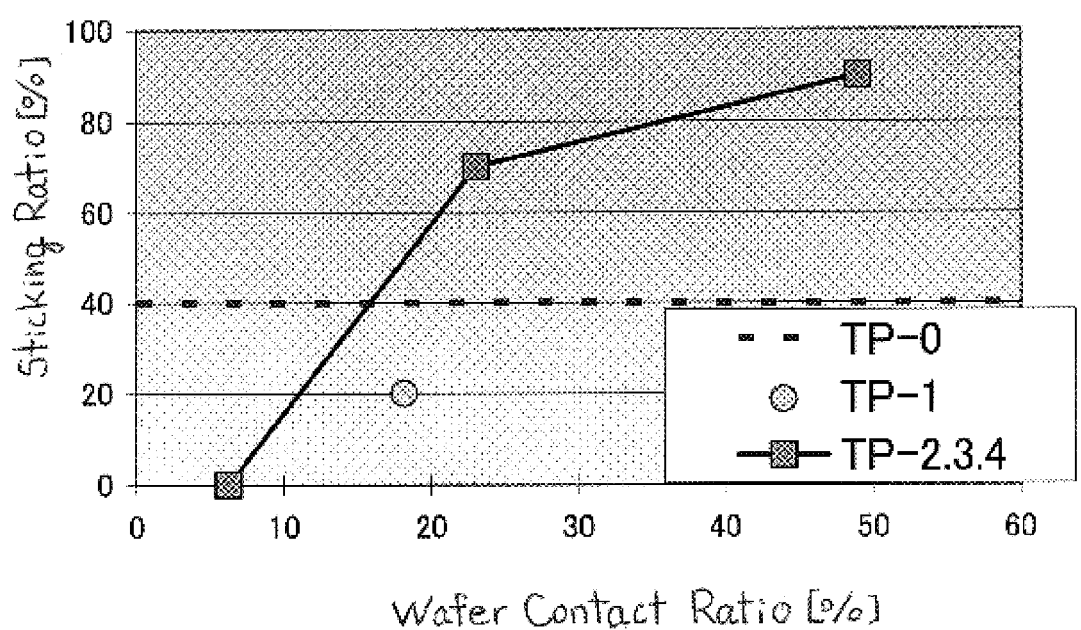

FIG. 6 is a graph showing the relationship between sticking ratios and wafer contact ratios when using the susceptors shown in FIG. 3.

Figure 7B:
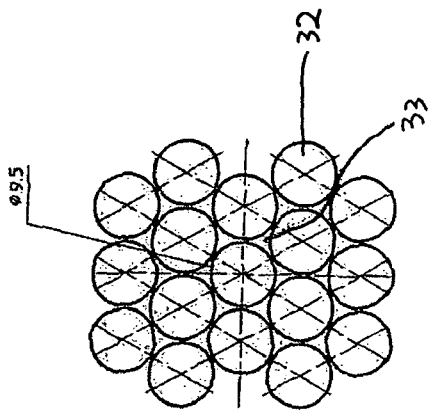
Figure 7C:
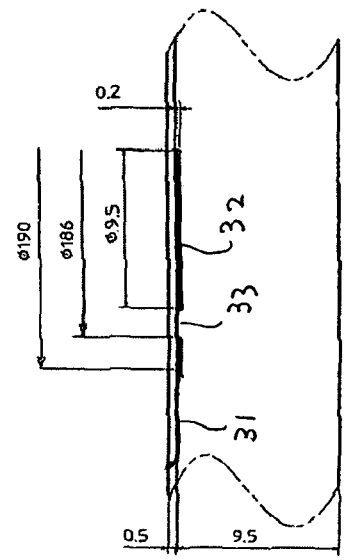
Figure 7A:
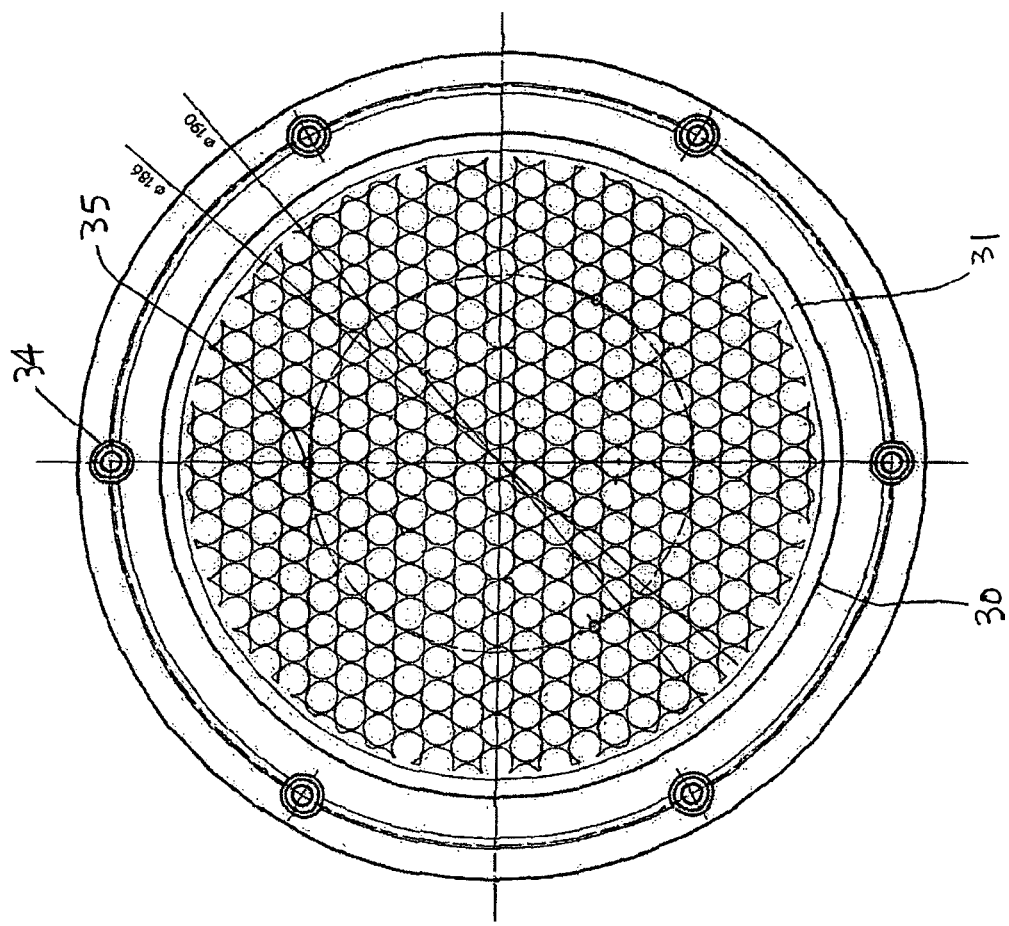

FIG. 7(a) is a top view of a susceptor according to an embodiment of the present invention. FIG. 7(b) is an enlarged partial view of the susceptor showing dimple patterns. FIG. 7(c) is a cross sectional view of a part of the susceptor.

FIG. 8(a) is a top view showing a half of a susceptor according to an embodiment of the present invention. FIG. 8(b) is a cross sectional view of the susceptor. FIG. 8(c) is a cross sectional view of a part of the susceptor.

DETAILED DESCRIPTION OF THE PREFERRED EMBODIMENT

The present invention will be explained with reference to preferred embodiments. The preferred embodiments are not intended to limit the present invention.

In an embodiment, the present invention provides a substrate-supporting device for CVD having a substrate-supporting region comprising: (i) a substrate-supporting surface which is a continuous surface defining a reference plane on which a substrate is placed; and (ii) multiple dimples having bottom surfaces lower than the reference plane, the respective dimples being isolated from each other by a portion of the substrate-supporting surface.

The above embodiment may further include the following embodiments:

The substrate-supporting surface may have an area which is less than 50% of that of the substrate-supporting region. In an embodiment, the area may be 40%, 30%, 20%, 10%, 5%, 3%, and ranges between any two numbers of the foregoing (preferably about 20% or less). In general, the less the contact area (i.e., the area of the substrate-supporting surface), the less the sticking of a substrate to the substrate-supporting surface occurs. As compared with a substrate-supporting device having a discontinuous contact surface instead of the continuous surface, even if the contact area of the continuous surface is equivalent to that of the discontinuous surface, surprisingly, the sticking of a substrate to the surface is significantly less than that of the discontinuous surface.

Each dimple may have a circular shape on the reference plane. In that case, the number of the multiple dimples may be three or more. Every three dimples adjacent to each other may be arranged such that imaginary lines connecting respective centers of the three circular shapes form an equilateral triangle.

In another embodiment, each dimple may have a rectangular shape. The substrate-supporting surface may be shaped into cross stripes or honeycomb shape.

The dimples may have any suitable shape including a circle, oval, triangle, quadrilateral, hexagon, polygon, slit, or a mixture of any of the foregoing. The dimples can consist of dimples of various sizes and/or shapes. The dimples are preferably arranged in a radically symmetrical pattern or uniformly distributed throughout the substrate-supporting region. In view of uniformity of quality and/or thickness within a film, the size and number of dimples may be selected. The number of the dimples may be in the range of 4 to 2,000 in an embodiment, 40 to 1,000 in another embodiment, and 100 to 500 in still another embodiment.

The substrate-supporting surface may have a peripheral area on the reference plane which has no dimple. The peripheral area may be called "a wafer pocket," which is in contact with the periphery of a substrate. The width of the peripheral area may be in the range of about 2 mm to about 20 mm (in another embodiment, about 5 mm to about 15 mm), depending on the sizes of the substrate, the configuration of a reactor, etc. The number of dimples described above is the number of dimples having a complete shape and does not include dimples at the peripheral area which do not have a complete shape.

The substrate-supporting region may have multiple lift pin holes. In an embodiment, the number of the lift pin holes is 3 or 4, and the lift pin holes are located approximately at the mid point between the center and the periphery of the substrate-supporting region.

The substrate-supporting surface may have a surface roughness (Ra) of about 1 μm or less. The device may be made of aluminum, aluminum alloy, alumina, aluminum nitride, etc., and the surface may be constituted by an anodized oxide film.

The dimples may have a depth of about 0.05 mm to about 1 mm in an embodiment, and about 0.1 mm to about 0.5 mm in another embodiment. The inner width of a dimple may be about 2 mm to about 50 mm in an embodiment, and about 5 mm to about 20 mm in another embodiment.

The substrate-supporting device may further comprise an outer peripheral area outside the substrate-supporting region, said outer peripheral area having a height which is higher than the reference plane. In an embodiment, the outer peripheral area may have a height of about 0.2 mm to about 10 mm, and in another embodiment, it may range from about 0.4 mm to about 1 mm. The outer peripheral area may have multiple holes for fastening screws (e.g., 3 to 10 holes).

The dimples can be produced by NC milling, chemical milling, or photoetching.

In another aspect, the present invention provide a CVD apparatus for forming a thin film on a substrate, comprising: (a) a vacuum chamber; (b) a gas inlet port installed in the vacuum chamber for introducing a gas into the vacuum chamber; and (c) any one of the foregoing substrate-supporting devices.

The CVD apparatus may further comprise a heater on which the substrate-supporting device is mounted and fixed with screws. The substrate-supporting device may be installed in a plasma CVD apparatus, preferably a capacitive coupled plasma CVD apparatus, although it can be installed in other types of CVD apparatuses such as a thermal CVD apparatus and HD (high density) CVD apparatus. In the case of a capacitive coupled plasma CVD apparatus, the gas inlet port may be a shower plate which serves as one electrode, and the substrate-supporting device may be installed practically parallel to and facing the shower plate and may serve as another electrode.

In all of the aforesaid embodiments, any element used in an embodiment can interchangeably be used in another embodiment unless such a replacement is not feasible or causes adverse effect. Further, the present invention can equally be applied to apparatuses and methods.

The present invention will be explained further with reference to the drawings. The drawings are not intended to limit the present invention. In the following embodiments, a susceptor is used as the substrate-supporting device, and a wafer is used as the substrate. Further, the dimple is referred to as a concave portion.

Using FIG. 2, a plasma CVD apparatus used as a semiconductor-manufacturing apparatus according to the present invention is explained below.

The plasma CVD apparatus 20 comprises a reaction chamber 6, a gas inlet port 5, and a second electrode composed of a susceptor 3 which is a supporting portion and a heater 2. From a gas line which is not shown, a gas is introduced through the gas inlet port 5. A circular first electrode 9 is disposed just below the gas inlet port 5. The first electrode 9 has a hollow structure and a number of fine pores on its bottom surface from which gas is jetted out to a wafer 4 which is a workpiece. Additionally, the first electrode 9 is configured to be replaceable with a shower plate 11 having multiple gas inlet holes for facilitating maintenance and reducing component costs.

Additionally, at the bottom of the reaction chamber 6, an exhaust port 10 is provided. The exhaust port 10 is joined with an external vacuum pump which is not shown, through which inside the reaction chamber 6 is exhausted. The susceptor 3 is disposed parallel to and facing the first electrode 9. The susceptor 3 supports a wafer 4 on it and heats the wafer 4 continuously by the heater 2 to maintain it at a given temperature (−50° C. to 650° C.). The gas inlet port 5 and the first electrode 9 are insulated from the reaction chamber 6 and connected to an external first radio-frequency power source 7. A second radio-frequency power source 8 may be connected at this time. Symbol 12 indicates grounding. Thus, the first electrode and the second electrode function as radio-frequency electrodes and generate a plasma field in the vicinity of the wafer 4. A type and properties of a film formed on a surface of the wafer 4 vary with a type and a flow of source gas, a RF frequency type, plasma spatial distribution and electrical potential distribution.

Here, a surface of the susceptor 21 is patterned to have regions of high and low elevations, and the high regions support a wafer and are continuous. It is effective when a contact area of the high regions with the wafer supported on them is 20% or less than the entire area of a wafer surface. A plane shape of a low region may be a circle, quadrilateral, hexagon or others.

In order to prevent wafer sticking, a contact area of the wafer and the susceptor 3 is reduced by patterning a surface of the susceptor 3 to have regions of high and low elevations. As described in U.S. Pat. No. 5,531,835, in a precedent wherein a contact area is reduced by forming independent dimples, because high regions are discontinuous, temperature distribution and flow of RF current become nonuniform within a wafer surface and film thickness distribution becomes worse. In contrast, when high regions are continuous, equal control effect on wafer sticking can be displayed even with a larger contact area as compared with discontinuous high regions, and the uniformity of in-plane temperature distribution and RF current flowing from plasma to within the wafer is maintained. Film thickness distribution, therefore, does not become worse.

Example

In this example, multiple circular dimples are disposed on a susceptor 21 as low regions for the reason of facilitating machining, etc. High regions are continuous. The susceptor is used for a ϕ200 mm wafer. A shape of the susceptor used in this example is shown in FIGS. 7(a)-(c). A depth of the circular dimple 32 is 0.2 mm; its inner diameter is 9.5 mm; a distance between the respective centers of circular adjacent dimples is 10 mm (consequently, a radial thickness is 0.5 mm). Additionally, every three dimples adjacent to each other are arranged such that imaginary lines connecting respective centers of the three circular shapes form an equilateral triangle (FIG. 7(b)). A side of the equilateral triangle is 10 mm.

Additionally, an outer diameter of the susceptor 21 is 250 mm; an outer diameter of a substrate-supporting region 31 is 201 mm; a width of a wafer pocket 31 is 6 mm; a height of a peripheral portion of the wafer pocket is 0.5 mm; an outer diameter of an area in which the dimples are provided is 190 mm; an outer diameter of a dimple area which forms a perfect circle is 186 mm (FIG. 7(c)). Additionally, high regions 33 are continuous at the same elevation including the wafer pocket 31. Additionally, holes 34 for fastening screws are provided in the peripheral area. Holes 35 for lift pins are provided within the wafer-supporting region 30 (FIG. 7(a)). Additionally, the susceptor is made of alumina and the surface is constituted by an anodized oxide film (a thickness of 45 μm; normally 10-100 μm).

A wafer contact ratio in the wafer-supporting region having the circular dimples is 18% (FIG. 3, TP-1).

In contrast, as shown in FIG. 3, in Comparative Examples 1-3, independent discontinuous quadrilateral dimples are arranged; a shape size is enlarged progressively as comparative examples go from 1 to 3. A wafer contact ratio is 6% (TP-2), 23% (TP-3) and 50% (TP-4) respectively. Additionally, in the case of a conventional example shown in in FIG. 3, blasting+chemical treatment (some etching) are given to the contact area (TP-0), and it is difficult to calculate a wafer contact ratio.

Figure 1:
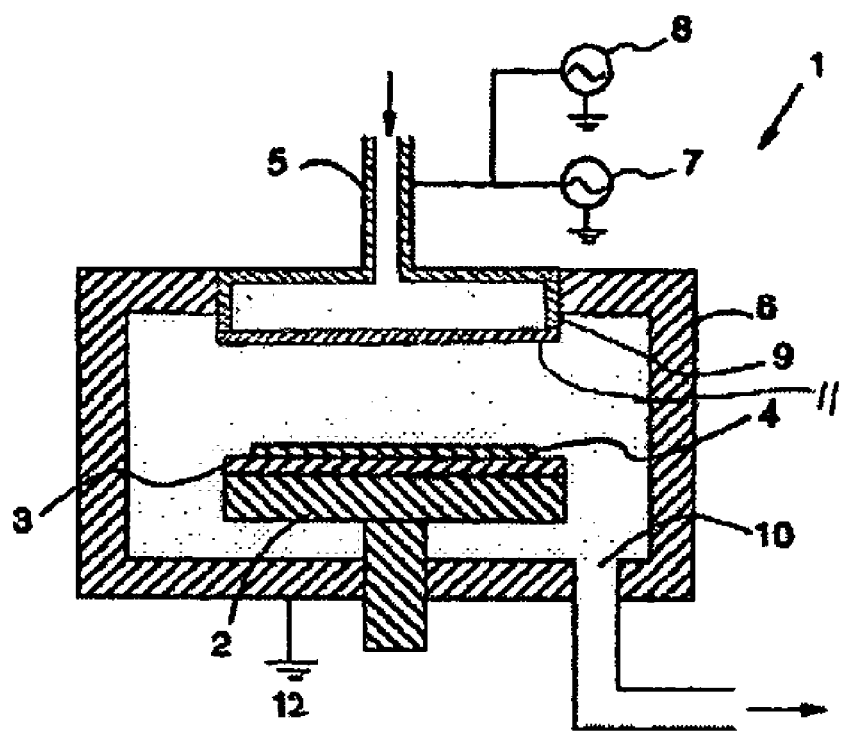
FIG. 1 is a schematic diagram of a conventional plasma CVD apparatus.
Figure 2:
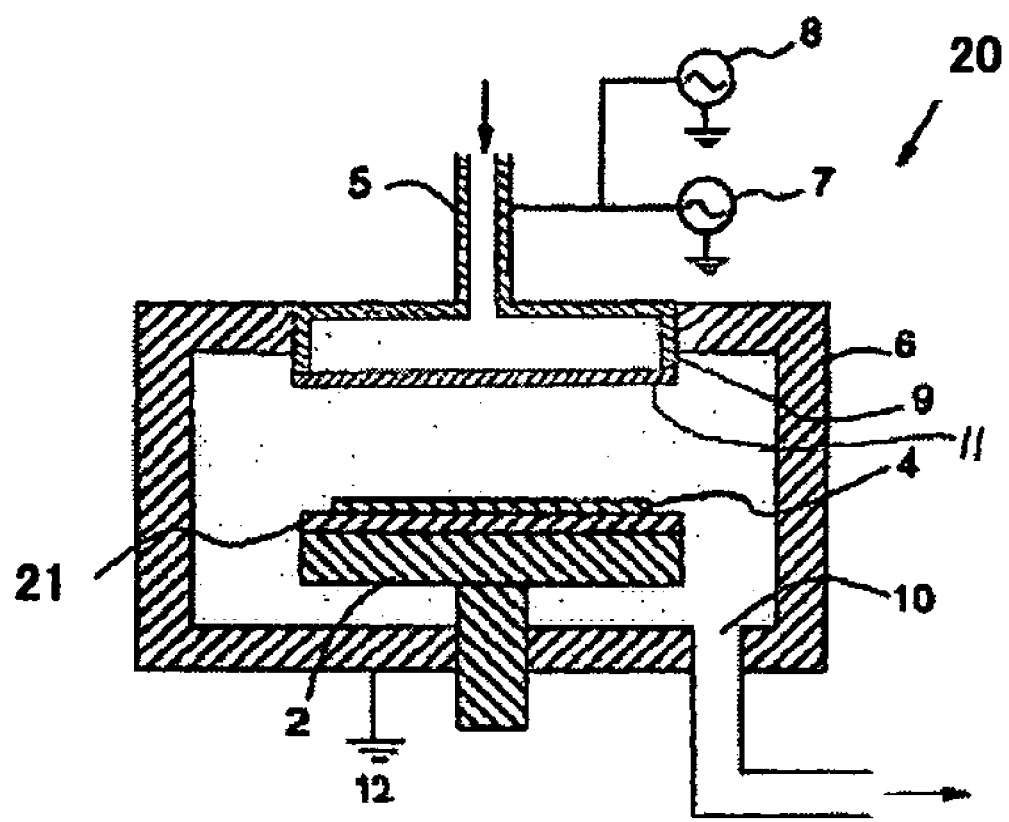
FIG. 2 is a schematic diagram of a plasma CVD apparatus according to an embodiment of the present invention.

In the examples, the plasma CVD apparatus shown in FIG. 2 was used; in the conventional example, the plasma CVD apparatus shown in FIG. 1 was used. For either cases, Dragon™ (ASM Japan K.K.) was used as a reactor.

Experimental Examples

Film type: TEOS

| Film Formation | |
|---|---|
| Source gas 1: | TEOS (100 sccm) |
| Source gas 2: | O2 (1000 sccm) |
| First RF power source (HRF): | 13.56 MHz (1.0 W/cm$^2$ - Anode standard) |
| Second RF power source (LRF): | 400 kHz (0.37 W/cm$^2$) |
| Substrate: | ϕ200 mm silicon substrate |

Result

FIG. 4 shows film formation results. FIG. 6 shows contact-area dependence of a wafer sticking ratio on a wafer and a susceptor when film deposition is carried out continuously on 10 pieces of wafers, each of which has both sides polished and the bottom surface coated with a silicon nitride film. Additionally, FIGS. 5(a)-(e) show mapping results of in-plane uniformity in each film. The reason why a silicon nitride film was coated on the bottom surface of a wafer with its both sides polished was to facilitate wafer sticking. As seen from uniformity values shown in FIG. 4 and mapping results shown in FIGS. 5(a)-(e), it is seen that the smaller a contact area of a wafer and a susceptor becomes, the more in-plane uniformity of film thickness distribution becomes worse. Additionally, from FIG. 6, it is seen that wafer sticking can be prevented if a contact area of the wafer and the susceptor is small. Because a contact ratio cannot be calculated in the conventional example, only a sticking ratio is shown. Consequently, in order to control wafer sticking, wafer sticking is improved if a contact ratio of the susceptor with the wafer is lowered; in-plane uniformity of film thickness distribution, however, becomes worse and stress increases.

In comparative examples, if a contact area (contact ratio) of the susceptor to a wafer area is approx. 20% (TP-3, 23%), a wafer sticking ratio becomes worse to approx. 1.75 times as compared with the conventional example (TP-0) (FIG. 6). If a contact ratio is 6% (TP-2), wafer sticking can be prevented (FIG. 6); in this case, film thickness nonuniformity increases to approx. three times that of the conventional example (TP-0) (FIG. 4), and stress increases by approx. 15% (FIG. 4). In the example of the present invention, in which the high regions are continuous (TP-1, 18%), even with a contact ratio of approx. 20%, a wafer sticking ratio can be reduced by half as compared with the conventional example (TP-0) without significantly worsening film thickness nonuniformity and stress (approximately at the same level as in TP-3) (FIG. 6), and having continuous high regions has a remarkable effect. Further, although it was impossible to avoid variations among susceptors in the conventional example, according to this example, it is easy and reliable to control machining and surface processing, and variations among susceptors can be lowered.

As described, in comparison with a case in which a contact area is reduced by forming independent convex portions, using a susceptor shape comprising continuous concave portions according to the present invention, the effect on prevention of wafer sticking can be remarkably increased by reducing a contact area of a wafer and a susceptor. Additionally, when a contact area by independent convex portions and a contact ratio of a wafer are approximately the same, uniformity of RF current flowing from plasma to the wafer is maintained and worsening of film thickness distribution can be controlled using a susceptor shape comprising continuous dimples according to the present invention because high regions are continuous.

In the above, the susceptor with circular dimples formed on its surface was used; a shape of the dimple, however, is not limited to a circular shape. The dimples may have any suitable shape including a circle, triangle, quadrilateral, hexagon, etc. and be arranged in a radial, lattice or honeycomb pattern. An example of a susceptor (susceptor 21') having square dimples formed is shown FIGS. 8(*a*)-(*c*).

Symbols 40, 41, 42, 43, 44 and 45 correspond respectively to 30, 31, 32, 33, 34 and 35 in FIGS. 7(*a*)-(*c*), and are equal in size to respective equivalents of the susceptor 21 shown in FIGS. 7(*a*)-(*c*). Additionally, one side of a square dimple is 9 mm; a width of a high region 43 between adjacent concavity squares is 1 mm. A wafer contact ratio is 19%.

Additionally, in the embodiment described above, a shape of the dimple on the substrate-supporting surface and a shape of the bottom surface of the dimple are the same (in other words, a sidewall from the substrate-supporting surface to the bottom surface is perpendicular to the substrate-supporting surface). In an embodiment, a sidewall from the substrate-supporting surface to the bottom surface of a dimple is sloped down.

Additionally, in the embodiment described above, the substrate-supporting device has a shape of the susceptor and is installed on a heater (having a thickness of approx. 5-20 mm; 10 mm in the above-mentioned embodiments); in an embodiment, the substrate-supporting device is integrated with a heater; hence, there are no holes for fastening screws.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A substrate-supporting device for CVD comprising:
    a substrate-supporting region for supporting a substrate within the region, said substrate-supporting region having an outer diameter larger than that of the substrate and consisting of a high elevation region and a low elevation region, wherein
        the high elevation region consists of a single continuous substrate-supporting surface defined on a reference plane on which the substrate is placed, said high elevation region extending from outer perimeters of the low elevation region to the outer diameter of the substrate-supporting region; and
        the low elevation region consists of geometrically patterned multiple dimples having bottom surfaces lower than the reference plane, the respective dimples being isolated from each other by a portion of the substrate-supporting surface as viewed from above the substrate-supporting surface, all of the dimples having closed bottoms.

2. The substrate-supporting device according to claim 1, wherein the substrate-supporting surface has an area which is less than 50% of that of the substrate-supporting region.

3. The substrate-supporting device according to claim 2, wherein the substrate-supporting surface has an area which is about 20% or less of that of the substrate-supporting region.

4. The substrate-supporting device according to claim 1, wherein each dimple has a circular shape on the reference plane.

5. The substrate-supporting device according to claim 4, wherein the number of the multiple dimples is three or more.

6. The substrate-supporting device according to claim 5, wherein every three dimples adjacent to each other are arranged such that imaginary lines connecting respective centers of the three circular shapes form an equilateral triangle.

7. The substrate-supporting device according to claim 1, wherein each dimple has a rectangular shape.

8. The substrate-supporting device according to claim 7, wherein the substrate-supporting surface is shaped into cross stripes.

9. The substrate-supporting device according to claim 1, wherein the substrate-supporting surface has a peripheral area on the reference plane which has no dimple.

10. The substrate-supporting device according to claim 1, wherein the substrate-supporting region has multiple lift pin holes.

11. The substrate-supporting device according to claim 1, wherein the substrate-supporting surface has a surface roughness (Ra) of about 1 µm or less.

12. The substrate-supporting device according to claim 1, wherein the substrate-supporting surface is constituted by an anodized oxide film formed on an aluminum or aluminum alloy.

13. The substrate-supporting device according to claim 1, wherein the dimples have a depth of about 0.05 mm to about 1.0 mm.

14. The substrate-supporting device according to claim 1, further comprising an outer peripheral area outside the substrate-supporting region, said outer peripheral area having a height which is higher than the reference plane.

15. The substrate-supporting device according to claim 14, wherein the outer peripheral area has multiple holes for fastening screws.

16. The substrate-supporting device according to claim 1, wherein the dimples have substantially the same depth.

17. A CVD apparatus for forming a thin film on a substrate, comprising:
    a vacuum chamber;
    a gas inlet port installed in the vacuum chamber for introducing a gas into the vacuum chamber; and
    the substrate-supporting device of claim 1 being installed in the vacuum chamber.

18. The CVD apparatus according to claim 17, further comprising a heater on which the substrate-supporting device is mounted and fixed with screws.

19. The CVD apparatus according to claim 17, which is a plasma CVD wherein the gas inlet port is a shower plate serving as one electrode, and the substrate-supporting device is installed practically parallel to and facing the shower plate and serves as another electrode.

* * * * *

UNITED STATES PATENT AND TRADEMARK OFFICE
CERTIFICATE OF CORRECTION

PATENT NO. : 7,691,205 B2
APPLICATION NO. : 11/252918
DATED : April 6, 2010
INVENTOR(S) : Yozo Ikedo It is certified that error appears in the above-identified patent and that said Letters Patent is hereby corrected as shown below:

Col. 1, line 26, please change "provided" to --provided. The-- therefor.

Col. 1, line 29, please change "to facing" to --to and facing-- therefor.

Col. 1, line 30, please change "wafer" to --wafer 4-- therefor.

Col. 1, line 35, please change "frequency source" to --frequency power source-- therefor.

Col. 6, line 15, please change "in in" to --in-- therefor.

Signed and Sealed this

Fourteenth Day of September, 2010

David J. Kappos
*Director of the United States Patent and Trademark Office*